(12) United States Patent
Biber et al.

(10) Patent No.: US 11,693,075 B2
(45) Date of Patent: Jul. 4, 2023

(54) MONITORING ARCHITECTURE FOR MAGNETIC RESONANCE TRANSMISSION SYSTEMS AND METHOD FOR OPERATING SAME

(71) Applicant: Siemens Healthcare GmbH, Erlangen (DE)

(72) Inventors: Stephan Biber, Erlangen (DE); Thorsten Speckner, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/705,273

(22) Filed: Mar. 25, 2022

(65) Prior Publication Data

US 2022/0308145 A1    Sep. 29, 2022

(30) Foreign Application Priority Data

Mar. 26, 2021 (DE) ..................... 10 2021 203 029.7

(51) Int. Cl.
*G01R 33/54* (2006.01)
*G01R 33/36* (2006.01)

(52) U.S. Cl.
CPC ....... *G01R 33/543* (2013.01); *G01R 33/3664* (2013.01)

(58) Field of Classification Search
CPC ................... G01R 33/543; G01R 33/3664
See application file for complete search history.

(56) References Cited

U.S. PATENT DOCUMENTS

| 2008/0182524 A1* | 7/2008 | Graesslin ............... H04B 17/23 455/73 |
| 2018/0024206 A1 | 1/2018 | Heismann |
| 2018/0156879 A1 | 6/2018 | Findeklee |

FOREIGN PATENT DOCUMENTS

| DE | 102016213579 A1 | 1/2018 |
| DE | 112016001879 T5 | 1/2018 |

OTHER PUBLICATIONS

MRI Question: "Performing an MR Scan"; publication date: Jan. 15, 2020https://web.archive.org/web/20200115160116/https://mriquestions.com/what-arethesteps.html.

* cited by examiner

*Primary Examiner* — G. M. A Hyder
(74) *Attorney, Agent, or Firm* — Lempia Summerfield Katz LLC

(57) ABSTRACT

A magnetic resonance tomography unit includes a transmitter, a transmission monitoring device for monitoring an excitation signal from the transmitter, and a plurality of transmit antennas. The magnetic resonance tomography unit also includes a switching device configured to bring the transmission monitoring device selectively into a signal connection to one transmit antenna of the plurality of transmit antennas. A method for operating the magnetic resonance tomography unit is also provided.

9 Claims, 4 Drawing Sheets

MONITORING ARCHITECTURE FOR MAGNETIC RESONANCE TRANSMISSION SYSTEMS AND METHOD FOR OPERATING SAME

This application claims the benefit of German Patent Application No. DE 10 2021 203 029.7, filed on Mar. 26, 2021, which is hereby incorporated by reference in its entirety.

BACKGROUND

The present embodiments relate to a magnetic resonance tomography unit and to a method for monitoring operation of the magnetic resonance tomography unit.

Magnetic resonance tomography units are imaging devices that, in order to map an object under examination, align nuclear spins of the object under examination with a strong external magnetic field, and use an alternating magnetic field to excite the nuclear spins to precess about this alignment. The precession or return of the spins from this excited state into a low-energy state produces, as a response, an alternating magnetic field that is received by antennas.

Gradient magnetic fields are used to apply spatial encoding to the signals, which enables the received signal to subsequently be associated with a volume element. The received signal is then analyzed, and a three-dimensional imaging representation of the object under examination is provided. Local receive antennas, known as local coils, which are arranged directly on the object under examination in order to achieve a better signal-to-noise ratio, may be used to receive the signal. The receive antennas may also be installed in a patient couch.

Radiofrequency pulses at powers in the kilowatt range are used in order to excite the nuclear spins, and are partially absorbed in the patient. To avoid risk to the patient, there are legal limits to the exposure from electromagnetic fields, and compliance with these limits is to be provided by monitoring measures.

Therefore, the magnetic resonance tomography unit has sensors usually for each transmit output and/or transmit antenna. The sensors may be used to monitor for correct operation.

Since the monitoring relates to safety, the sensors and associated evaluation circuitry are often designed for redundancy. Expenditure is also required to eliminate deviations over time as a result of aging. The costs of monitoring measures are therefore high.

SUMMARY AND DESCRIPTION

The scope of the present invention is defined solely by the appended claims and is not affected to any degree by the statements within this summary.

The present embodiments may obviate one or more of the drawbacks or limitations in the related art. For example, less costly monitoring is provided.

The magnetic resonance tomography unit according to the present embodiments has a transmitter for exciting, by radiofrequency excitation signals, nuclear spins to be detected. The transmitter has a power of more than 500 W, 1 kW, or 5 kW. The magnetic resonance tomography unit according to the present embodiments also has a transmission monitoring device for monitoring an excitation signal from the transmitter. The transmission monitoring device is configured to monitor an output signal from the transmitter (e.g., to monitor for limit values being exceeded). The transmission monitoring device may also be configured to interrupt emission from the transmitter via a signal connection.

The magnetic resonance tomography unit has a plurality of transmit antennas. These transmit antennas may be, for example, a body coil and a transmit local coil suitable for transmission. In one embodiment, the body coil has a plurality of channels (e.g., two) in order to produce a circularly polarized alternating magnetic field using two signals offset in phase by 90 degrees. The channels may be produced actively and independently of each other by separate amplifiers or by signal-splitting using passive elements.

The magnetic resonance tomography unit also includes a switching device. The switching device is configured to bring the transmission monitoring device selectively into a signal connection to one of the transmit antennas. The switching device may have, for example, electromechanical switches such as relays or MEMS, or electronic switches such as field effect transistors or PIN diodes. For digitized signals, logic gates may also be provided. In the context of the present embodiments, the transmission monitoring device may have a sensor for detecting the excitation signal. The sensor may be a directional coupler or a pickup coil, for example.

The sensor may be arranged in a fixed manner in, or at, a transmit path between the transmitter and the transmit antenna in order to detect a radiofrequency power on the transmit path, and the switching device makes a signal connection between the sensor and the transmission monitoring device in order to transfer a signal containing information about the detected radiofrequency power. Each transmit antenna, or the transmit path thereof, may be assigned a sensor, to which the transmission monitoring device may selectively establish a signal connection via the switching device.

In one embodiment, however, the switching device is configured to connect the transmit path, including the sensor integrated therein, to another transmit antenna, so that the transmission monitoring device may monitor a radiofrequency power radiated by the transmit antenna.

The magnetic resonance tomography unit according to the present embodiments with the switching device makes it possible to monitor different transmit antennas cost-effectively.

The method according to the present embodiments for operating a magnetic resonance tomography unit is performed on a magnetic resonance tomography unit according to the present embodiments having a transmitter, a transmission monitoring device for monitoring an excitation signal from the transmitter, and a plurality of transmit antennas. The magnetic resonance tomography unit has a switching device that is configured to bring the transmission monitoring device selectively into a signal connection to one of the transmit antennas. For example, the magnetic resonance tomography unit has more transmit antennas, or more plug-in slots for transmit antennas, than the transmission monitoring device has signal inputs for monitoring signals.

In an act of the method, a transmit local coil is connected to the magnetic resonance tomography unit. For example, an operator may plug a transmit local coil into a plug-in slot of the magnetic resonance tomography unit. However, in one embodiment, the magnetic resonance tomography unit may connect different segments of an antenna array to the transmitter successively by a switch while the patient travels through an acquisition region during a full-body scan. In the context of the present embodiments, a transmit coil for exciting the nuclear spins that is not permanently part of the magnetic resonance tomography unit, or at least not permanently connected to the transmitter, is deemed to be a transmit local coil.

In a further act, a signal connection is made between the transmission monitoring device and the transmit local coil using the switching device. As already explained with reference to the magnetic resonance tomography unit according to the present embodiments, this may take place by bringing a sensor in the transmit path into a signal connection to the transmission monitoring device, or by connecting the transmit path, including the sensor, to the transmit local coil using the switching device.

In another act of the method according to the present embodiments, the transmitter emits an excitation signal via the transmit local antenna.

In one act, the signal monitoring device receives a monitoring signal from the transmit local coil via the signal connection. The monitoring signal contains information about the excitation signal (e.g., about a field strength of a radiofrequency alternating magnetic field produced by the transmit local coil or of a power of the excitation signal). For example, a directional coupler as the sensor may be arranged in the input line to the transmit local coil. A pickup coil in the transmit local coil may also be provided. The monitoring signal may also be pre-conditioned in the sensor (e.g., rectified, filtered, amplified, and even digitized).

In another act, the transmission monitoring device compares the monitoring signal with a reference value. For example, the reference value may be a peak value and/or a time-averaged value that is not to be exceeded.

In a further act, depending on the comparison, the transmission monitoring device interrupts the emission by the transmitter via a signal connection. An interruption may be performed if the reference value is exceeded.

The method according to the present embodiments shares the advantages of the magnetic resonance tomography unit according to the present embodiments.

In an embodiment of the magnetic resonance tomography unit, the transmission monitoring device has a plurality of sensors for detecting a radiofrequency power. The magnetic resonance tomography unit also has a plurality of transmit paths that provide a signal connection for the excitation signal(s) between transmitter and the plurality of transmit antennas. The plurality of sensors are arranged respectively in the plurality of transmit paths to the plurality of transmit antennas (e.g., at least one sensor per transmit path), so that each sensor may detect a radiofrequency power on the associated transmit path. In the context of the present embodiments, a radiofrequency power may be detected by a measured value, from which the radiofrequency power may be determined. For example, given a known current or voltage and a known impedance of the transmit antenna at the feed point, it is possible to deduce the radiofrequency power. The sensor provides a signal containing information about the radiofrequency power, and transfers the signal to the transmission monitoring device via a signal connection. The signal may be analog or digital, depending on the preprocessing by the sensor. In one embodiment, two sensors are on one transmit path (e.g., in order to provide redundancy) to detect the forward signal and reverse signal in the case of directional couplers, or to detect current and voltage.

Switching of the sensors into the transmit paths, which is costly because of the high power, may be avoided by a sensor in each transmit path.

In a possible embodiment of the magnetic resonance tomography unit, the switching device is configured to bring, controlled by the transmission monitoring device, at least one predetermined sensor of the plurality of sensors into a signal connection to the signal monitoring device. Hence, one signal input, or at least fewer signal inputs than the number of transmit paths and/or transmit antennas of the transmission monitoring device, may detect a larger number of sensors in alternation.

In one embodiment, using the switching device for the signal paths, additional signal inputs for transmit antennas that are not in simultaneous use, which involve considerable expense because of the required accuracy and reliability, may be dispensed with. In addition, a transmission monitoring device of the same type may be used in different magnetic resonance systems having a different number of transmit antennas.

In an embodiment of the magnetic resonance tomography unit, the transmission interference suppression device is configured to scale a signal from the predetermined detector by a predetermined weighting. This weighting may be a calibration of the particular sensor that takes into account the different characteristics. The transmission monitoring device may have, for this purpose, a memory that is configured to store a plurality of calibrations datasets for the plurality of sensors. The transmission monitoring device is also configured to apply a calibration dataset suitable for the predetermined sensor during a comparison with a threshold value, which comparison is described below. The calibration dataset may have a table of values to be used as multipliers of the signals of the sensor. However, the calibration dataset may also provide, for example, parameters such as coefficients of a polynomial, by which the signals are multiplied, or into which the signals are inserted as the input value. Hybrid forms in which a calibration factor is interpolated between two table values may also be provided.

By using different calibration data, it is possible to handle different sensors and sensor types using the same signal input. For example, the power values for body coils and local transmit coils differ by a factor of 2, 5, 10, or more.

In an embodiment of the magnetic resonance tomography unit, the transmission monitoring device has a sensor with a signal connection to the transmission interference suppression device. In this case, the signal connection may be permanent (e.g., cannot be changed by the switching device). The sensor is arranged in, or on, a transmit path in order to detect the excitation signal in the transmit path. The transmit path includes the signal connection between a signal output of the transmitter for an excitation signal and a connection point at a transmit antenna. The switching device is part of the transmit path and is configured to bring, controlled by the transmission monitoring device, the transmit path into a signal connection to a predetermined transmit antenna for emitting a signal, at the connection point of the transmit antenna.

Since the sensor may be connected by the transmit path to different transmit antennas, a number of sensors that is fewer than the plurality of transmit antennas is sufficient for monitoring the active transmit antennas.

In an embodiment of the magnetic resonance tomography unit, the transmit path has a hybrid coupler having at least two signal outputs. A hybrid coupler is a passive circuit (e.g., composed of capacitances, inductances and/or resistances) that splits a signal from a signal input between two signal outputs. The splitting may also include a phase shift and/or impedance transformation that differs for the signal outputs. Hybrid couplers of this type are used, for example, to split a single excitation signal between two connection points of a body coil so as to produce a circularly polarized B1 field.

The hybrid coupler may be a four-port 90-degree hybrid coupler. The transmitter is connected to a signal input of the hybrid coupler in this case. At least two signal outputs of the hybrid coupler may be switchably connected using the switching device selectively to a first transmit antenna (e.g., to two connection points of a body coil in order to produce a circularly polarized alternating magnetic field), or to a second transmit antenna (e.g., a local transmit coil such as a knee coil). In this case, the third signal output, or the fourth port, of the four-port 90-degree hybrid coupler is terminated by a terminating resistor so that power reflected at the open signal output, which is not assigned to the transmit local coil, is converted into heat in the terminating resistor. For a knee examination using the knee coil, the switching device then connects one of the outputs of the hybrid coupler to the plug-in slot of the transmit local coil.

Since the transmit local coil may be operated at a lower power compared to the body coil, by terminating the unused output of the hybrid coupler, simple switching and monitoring of the transmit local coil may be provided.

In a possible embodiment of the magnetic resonance tomography unit, the transmit path has a hybrid coupler having at least two signal outputs. In this embodiment, the switching device is configured to connect the transmit path to the predetermined transmit antenna, bypassing the hybrid coupler. In other words, the switching device makes a signal connection from the transmitter via the transmit path to the predetermined transmit antenna for emitting the excitation signal. To do this, the switching device may disconnect the hybrid coupler from the transmit path and simultaneously from the transmitter, and connect the transmit path directly to the predetermined transmit antenna. In one embodiment, however, the switching device leaves the hybrid coupler in a signal connection to the transmit path, and switches in parallel therewith a direct signal connection to the predetermined transmit antenna. It is then to be provided, however, that the signal paths and terminations of the signal paths are configured such that negligible power flows into the hybrid coupler (e.g., less than 20%, 10%, 5%, or 1%). In one embodiment, for example, the signal outputs of the hybrid coupler are open, and the hybrid coupler has a signal path equal to half the wavelength Lambda of the excitation signal, or more generally Lambda*(2n+1)/2, where n is a natural number including zero, so that the path via the hybrid coupler actually appears to have an impedance tending to infinity at the connection point of the hybrid coupler to the transmit path. This may also be achieved by short-circuiting the signal outputs of the hybrid coupler, and the signal path being equal to a quarter of the wavelength Lambda, or generally Lambda*(2n+1)/4, where n is a natural number including zero.

In an embodiment of the method, the magnetic resonance tomography unit has a hybrid coupler. In the act of connecting the transmit local coil to a first signal output of the hybrid coupler, the switching device terminates a second signal output of the hybrid coupler with a terminating resistor. The terminating resistor may match the impedance of the signal output of the hybrid coupler or of the transmit antenna in order to avoid a reflection. If, however, as previously described, the hybrid coupler is part of an impedance transformer, the terminating resistor may also differ therefrom, as already stated.

The switching device and a hybrid coupler may be used to provide, even for a transmitter having only one transmitter output, both a low-cost drive for the body coil and switching to a local transmit coil.

DETAILED DESCRIPTION

Figure 1:
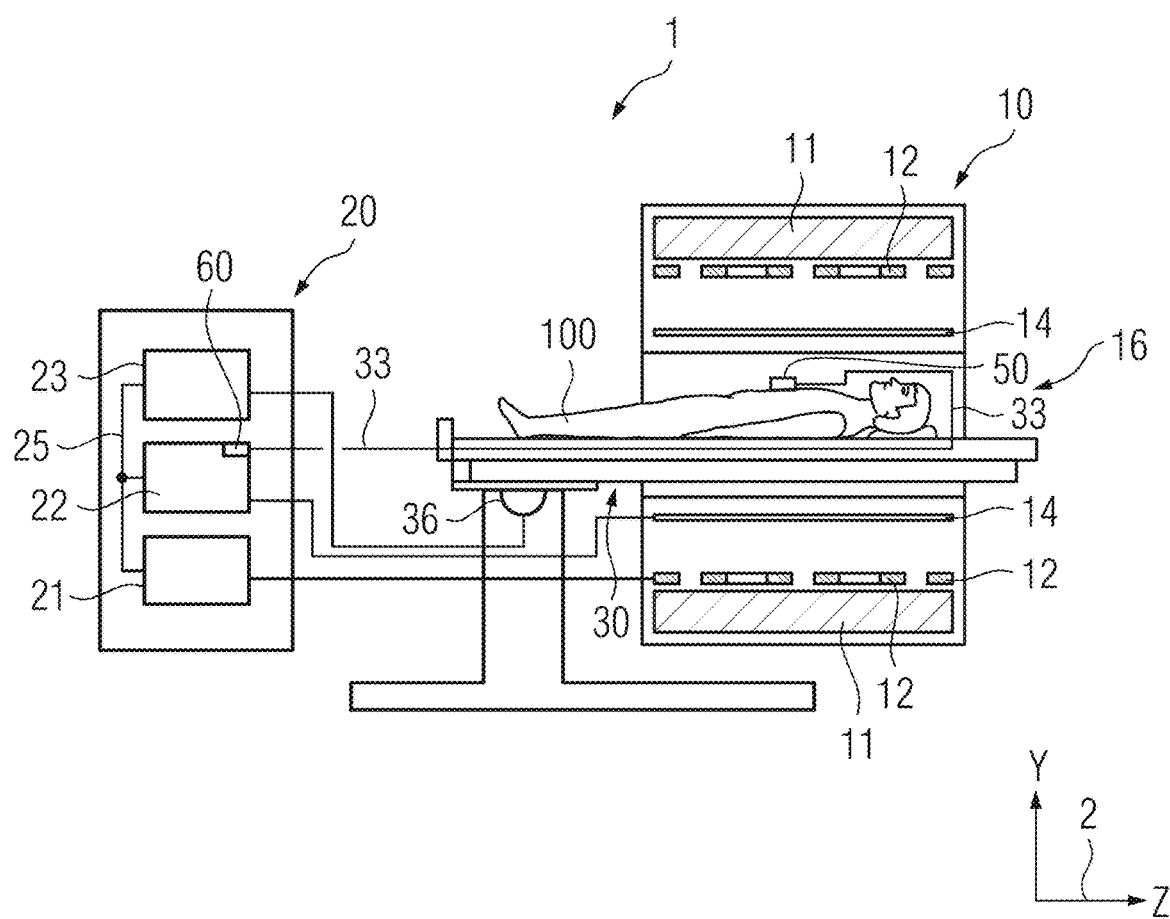
FIG. 1 shows a schematic diagram of one embodiment of a magnetic resonance tomography unit.

FIG. 1 shows a schematic diagram of an embodiment of a magnetic resonance tomography unit 1.

The magnet unit 10 has a field magnet 11 that produces a static magnetic field B0 for aligning nuclear spins of samples or of the patient 100 in an acquisition region. The acquisition region is characterized by an extremely homogeneous static magnetic field B0. The homogeneity relates, for example, to the magnetic field strength or magnitude. The acquisition region is approximately spherical and located in a patient tunnel 16 that extends through the magnet unit 10 in a longitudinal direction 2. A patient couch 30 may be moved inside the patient tunnel 16 by the travel unit 36. The field magnet 11 is usually a superconducting magnet that may provide magnetic fields having a magnetic flux density of up to 3 T or even higher in the latest equipment. For lower magnetic field strengths, however, permanent magnets or electromagnets having normal-conducting coils may also be used.

The magnet unit 10 also has gradient coils 12 that are configured to superimpose time-varying and spatially varying magnetic fields in three spatial dimensions on the magnetic field B0 for the purpose of spatial discrimination of the acquired mapping regions in the volume of interest. The gradient coils 12 are usually coils made of normal-conducting wires that may generate mutually orthogonal fields in the volume of interest.

The magnet unit 10 also has a body coil 14 that is configured to radiate into the volume of interest a radiofrequency signal supplied via a signal line, and to receive resonance signals emitted by the patient 100 and to output the resonance signals via a signal line.

A control unit 20 supplies the magnet unit 10 with the various signals for the gradient coils 12 and the body coil 14, and analyzes the received signals.

Thus, the control unit 20 has a gradient controller 21 that is configured to supply the gradient coils 12 via supply lines with variable currents that provide, coordinated in time, the desired gradient fields in the volume of interest.

In addition, the control unit 20 has a radiofrequency unit 22 that is configured to produce a radiofrequency pulse having a defined variation over time, amplitude, and spectral power distribution for the purpose of exciting magnetic resonance of the nuclear spins in the patient 100. Pulse powers may reach in the region of kilowatts here. The excitation signals may be radiated via the body coil 14 or via a local transmit antenna into the patient 100.

A controller 23 communicates via a signal bus 25 with the gradient controller 21 and the radiofrequency unit 22.

Arranged on the patient 100 is a local coil 50 that may be connected via a connecting line 33 to the radiofrequency unit 22 and a receiver of the radiofrequency unit 22.

The local coil 50 as the local transmit coil has a transmit function and is arranged on or against the patient 100 when only a subregion is to be examined Examples of local transmit coils are knee, chest, or head coils, for example.

A transmission monitoring device 60 of the radiofrequency unit 22, which is described in greater detail with reference to FIGS. 2 to 4, monitors the transmit function.

Figure 2:
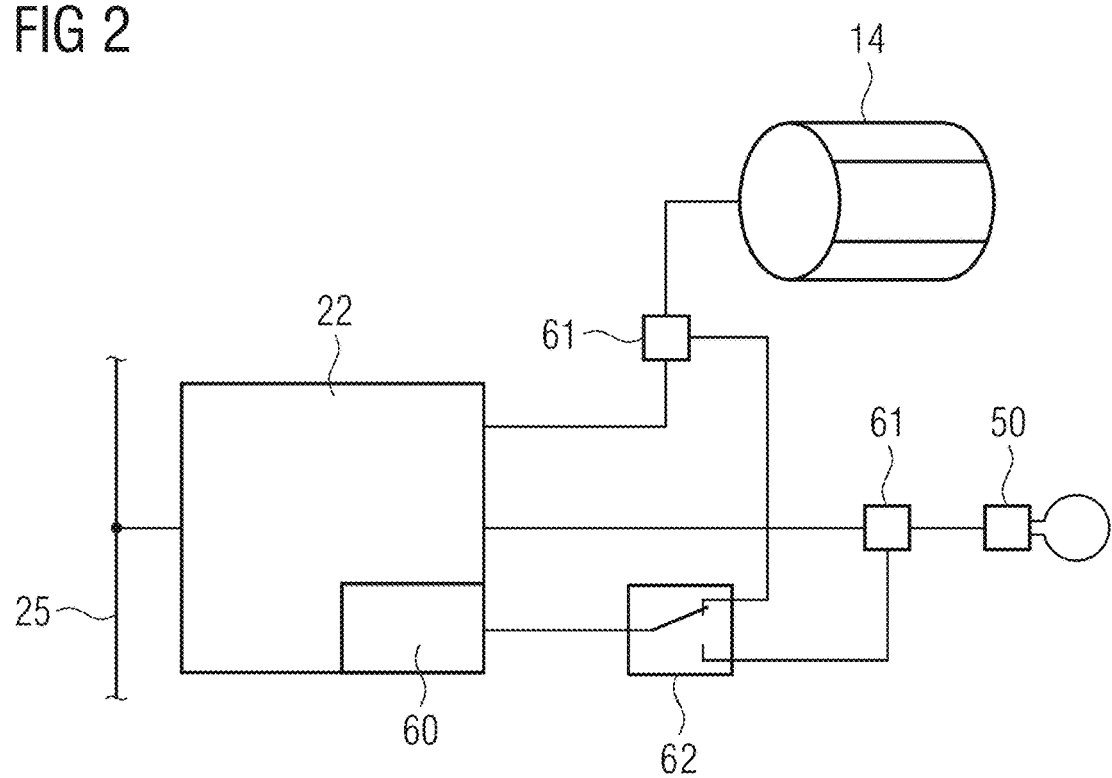
FIG. 2 shows a schematic diagram of components specific to an exemplary embodiment.

FIG. 2 shows components of the magnetic resonance tomography unit according to the present embodiments, which in one embodiment, are involved in the transmission process and the monitoring thereof.

A radiofrequency signal to be emitted (e.g., an excitation signal) is produced in the radiofrequency unit 22. The control unit 20 coordinates the emission with the other components such as the gradient controller 21 as part of an image acquisition sequence. For example, control signals are transferred for this purpose via a signal bus 25.

The radiofrequency unit has two signal outputs that have a signal connection to two transmit antennas (e.g., a body coil 14 and a local coil 50 as the local transmit antenna). In one embodiment, there are further signal outputs of the radiofrequency unit 22 (e.g., a further output with a signal connection to the body coil 14 in order to produce a circularly polarized alternating magnetic field) or for further local transmit coils.

In the radiofrequency unit 22, the radiofrequency signals are provided, for example, by oscillators and radiofrequency power amplifiers, which are not shown in detail here for the sake of clarity.

A sensor 61 for detecting information about the excitation signal is arranged in each of the signal connections between the radiofrequency unit and the transmit antennas, referred to below as the transmit path, via which transmit antennas the excitation signal is emitted. For example, the sensors may be one or more directional couplers in order to detect a forward and/or reverse radiofrequency amplitude and/or radiofrequency power. In one embodiment, a pickup coil that may be used to directly detect a radiofrequency alternating magnetic field produced by the excitation signal may be provided. The sensor 61 may also include initial parts of a signal conditioner (e.g., pre-amplifiers, matching elements, filters, or analog-to-digital converters).

A switching device 62 has a signal connection to the sensors 61, from which the switching device 62 receives the produced signals containing information about the radiofrequency signals on the transmit paths. The switching device 62 also has a signal connection to the transmission monitoring device 60 and is configured to select and transfer to the transmission monitoring device, under the control of the magnetic resonance tomography unit 1, at least one of the signals from the sensors 61. In an embodiment that is not shown in FIG. 2 having a plurality of signal connections between the switching device 62 and the transmission monitoring device 60, however, there may also be a plurality of sensors 61 connected at one time to the transmission monitoring device 60 (e.g., in the case of a local coil array such as a spine coil). The signal connection between the sensor 61 and the transmission monitoring device 60 may be a low-power connection that may be switched and multiplexed using small and inexpensive switches (e.g., even by semiconductor switches).

In one embodiment, additional transmit antennas are present beyond the transmit antennas shown in FIG. 2, with the sensors 61 of some transmit paths to these transmit antennas being permanently connected to the transmission monitoring device 60, and, for example, only the sensors 61 of transmit paths to local transmit antennas being switchably connected via the switching device 62.

The transmission interference suppression device 60 may be configured to assess the signal according to the sensor 61 connected by the switching device 62. For example, the transmission monitoring device 60 may have a calibration memory, in which calibration data for each of the sensors 61 is stored. For example, these may be parameters for a weighting function that are used as multipliers of signal values. A table containing corresponding value pairs, with the transmission monitoring device 60 interpolating between the table values, may also be provided. Differences in the sensitivity, the characteristic, and/or offset of the sensors 61 may thereby be taken into account.

Figure 3:
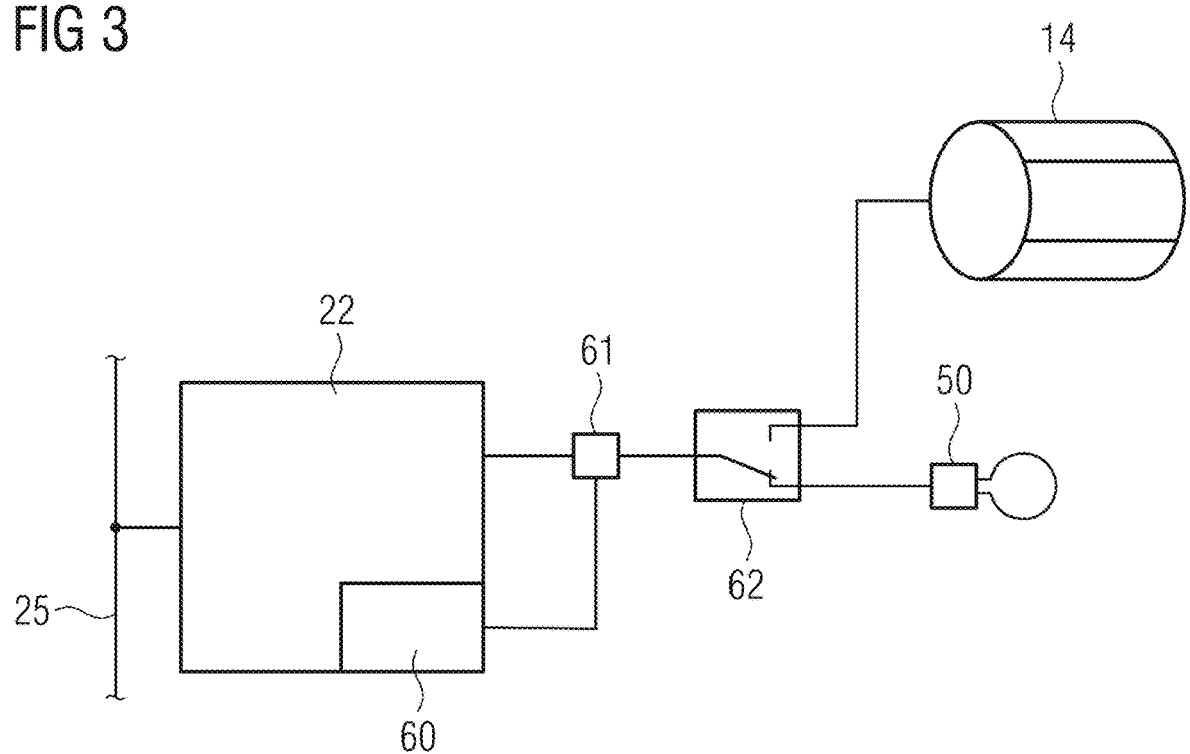
FIG. 3 shows a schematic diagram of components specific to an exemplary embodiment.

FIG. 3 shows another embodiment. FIG. 3 differs in subject matter in that the sensor 61 is permanently arranged in the transmit path between the radiofrequency unit 22 and the switching device. The sensor 61 also has a permanent signal connection to the transmission monitoring device 60. In this embodiment, the switching device 62 does not switch the signal connection between different sensors 61 and the transmission monitoring device 60, but switches the transmit path after the switching device 62 to different transmit antennas. A plurality of transmit antennas may thereby be monitored by a single sensor 61.

Figure 4:
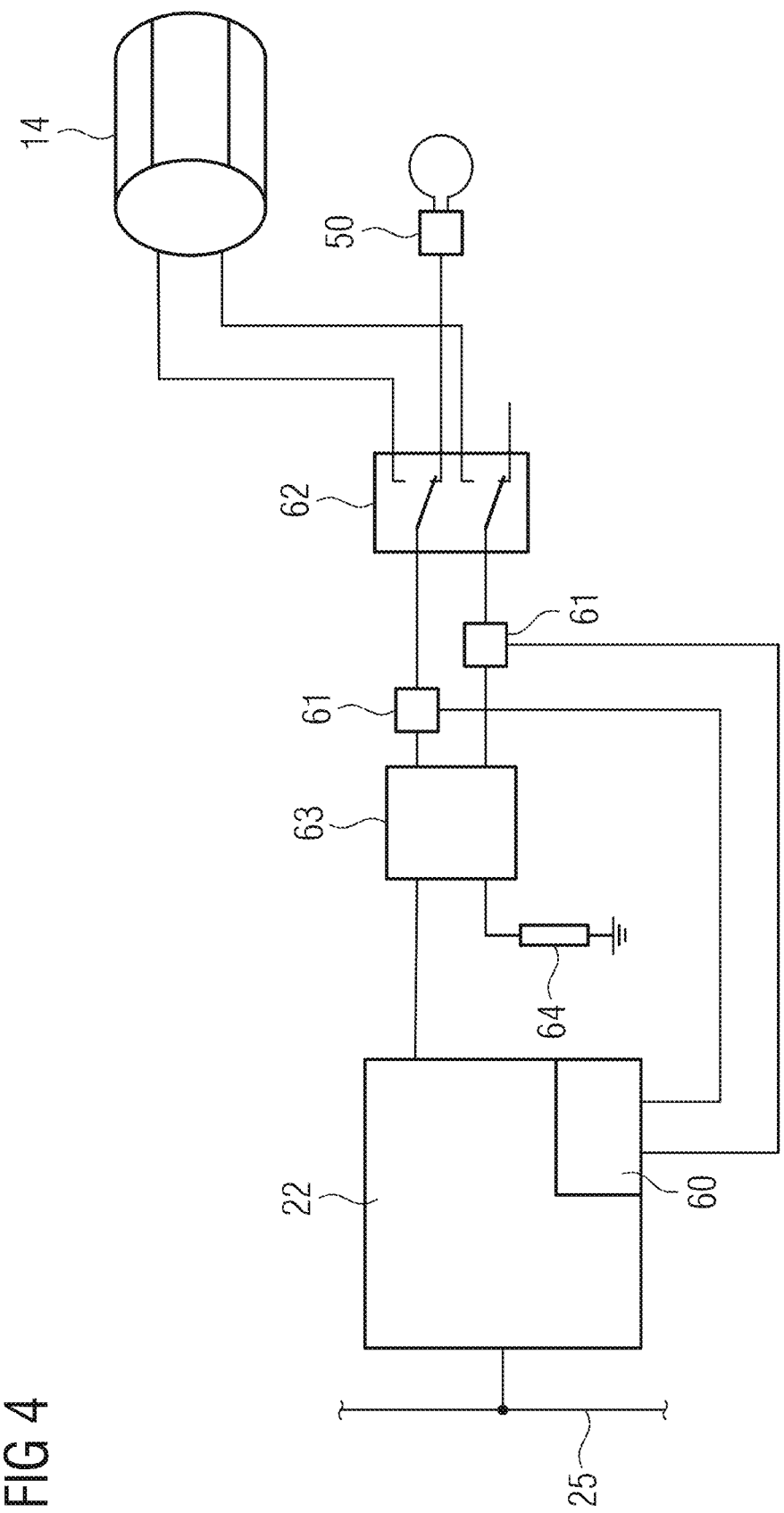
FIG. 4 shows a schematic diagram of components specific to an exemplary embodiment.

FIG. 4 shows a development of the embodiment from FIG. 3. In this embodiment, a hybrid coupler 63 is arranged between the radiofrequency unit 22 on the transmitter side and the sensors 61 and the switching device 62 on the antenna side. The excitation signal from the transmitter of the radiofrequency unit 22 to the transmit antenna is fed to one port. In an embodiment, the hybrid coupler produces therefrom two output signals offset in phase by 90 degrees. The output signals may be connected via the switching device 62, for example, to two connection points of a body coil 14 in order to produce a circularly polarized alternating magnetic field for exciting the nuclear spins. In another switch setting, the switching device connects a first signal output of the hybrid coupler 63 to a local transmit antenna. The signal outputs of the hybrid coupler 63 are selected in this case such that, given a second signal output that remains unconnected, a radiofrequency power present there is reflected to a terminating resistor 64 at a third signal output, and converted there into heat. In one embodiment, however, the switching device connects a further transmit antenna to the second signal output.

The hybrid coupler 63 may reduce the number of required transmit output stages in the radiofrequency unit 22 while protecting by the terminating resistor 64 the output stage from reflected power if only one local transmit coil is connected to the first signal output.

The invention is not restricted to the presented embodiments. For example, hybrid forms may also be provided. For example, only some of the antennas may be switchable (e.g., local transmit coils), and therefore, because of the lower transmit power that must be switched compared with the body coil 14, the switches may be simpler and less costly. In one embodiment, only some of the sensors 61 and/or the transmit paths may be switchable. For example, the body coil 14 or its sensors 61 may be permanently connected.

Figure 5:
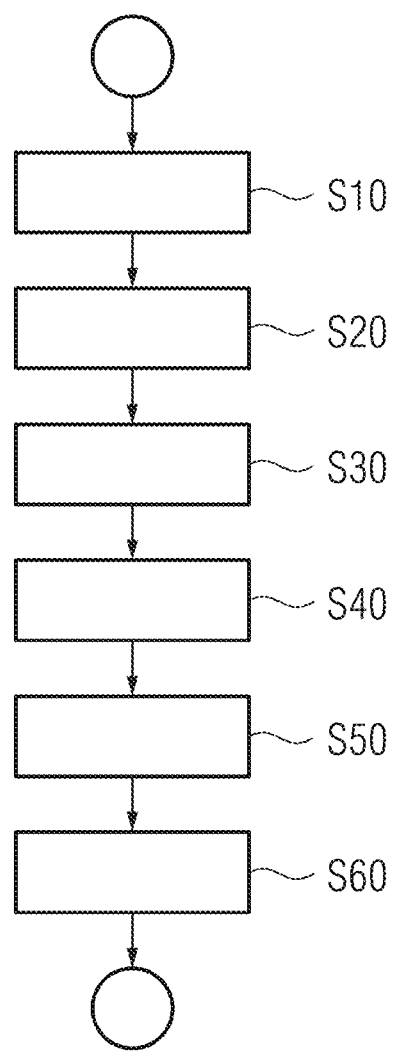
FIG. 5 shows a schematic flow diagram showing a method according to an embodiment.

FIG. 5 shows a flow diagram of an embodiment of a method.

The method according to the present embodiments is performed on a magnetic resonance tomography unit according to the present embodiments.

In act S10 of the method, a transmit local coil is connected to the magnetic resonance tomography unit 1. This may take place by an operator, for example, who plugs a transmit local coil 50 into a plug-in slot of the magnetic resonance tomography unit 1, thereby making an electrical connection. In one embodiment, the transmit local coil is part of an antenna array (e.g., part of a spine coil) that the controller 23 connects to the radiofrequency unit using a switching matrix.

In an embodiment, the magnetic resonance tomography unit 1 has a hybrid coupler 63, and the transmit local coil is connected to a first signal output of the hybrid coupler 63. In one embodiment, given a second signal output that is unassigned, the power is reflected there and may be guided to a fourth signal output of the hybrid coupler 63 that is terminated by a terminating resistor 64.

In another act of the method, the control unit 20 of the magnetic resonance tomography unit 1 makes a signal connection between the transmission monitoring device 60 and the transmit local coil using the switching device 62.

This may take place by the sensor 61 having a fixed signal connection to the transmit local coil, or to the plug-in slot of the transmit local coil 50, and the switching device 62 making a feedback connection for the sensor signal from the sensor 61 to the transmission monitoring device 60 via the switching device 62. In this case, the number of signal inputs for sensor signals for the transmission monitoring device 60 may be less than the number of sensors 61.

In another embodiment of the magnetic resonance tomography unit 1, the sensor 61 may be arranged in a fixed manner in a transmit path between radiofrequency unit 22 and the switching device 62, and a continuous signal connection may exist between the sensor 61 and the transmission monitoring device. The control unit 20 then makes the signal connection to the transmit local coil, by the switching device 62 switching the transmit path through to the transmission monitoring device 60.

In a further act S30, the transmitter of the radiofrequency unit 22 emits the excitation signal via the transmit local coil.

In another act S40, the transmission monitoring device 60 receives a monitoring signal from the transmit local coil via the signal connection. The monitoring signal has information about the excitation signal that the sensor 61 has obtained via the excitation signal. The monitoring signal may be produced, for example, by a directional coupler as the sensor 61, and may be a voltage that is proportional to a forward and/or reverse power. In the case of a pickup coil as the sensor 61, the voltage may also be proportional to a field strength produced by the transmit antenna. The signal may also be filtered, rectified, or even digitized.

In a further act S50, the transmission monitoring device 60 compares the monitoring signal, or the information about the excitation signal, with a reference value. For example, the reference value may be a peak value that is not be exceeded. Also conceivable, for example, is a weighted average.

The transmission interference suppression device 60 uses, for example, a different weighting, characteristic, or threshold value according to the connected sensor 61 or transmit antenna.

In another act S60, depending on the comparison, the transmission monitoring device 60 interrupts the emission of the excitation signal by the radiofrequency unit 22. For example, the transmission monitoring device 60 may ascertain in the comparison that the excitation signal is exceeding a threshold value, and may send via the signal bus 25 an interrupt signal to the radiofrequency controller.

Although the invention has been illustrated and described in detail using the exemplary embodiments, the invention is not limited by the disclosed examples, and a person skilled in the art may derive other variations therefrom without departing from the scope of protection of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance tomography unit comprises:
   a transmitter;
   a transmission monitoring device configured to monitor an excitation signal from the transmitter;
   a plurality of transmit antennas; and
   a switching device configured to bring the transmission monitoring device selectively into a signal connection to one transmit antenna of the plurality of transmit antennas.

2. The magnetic resonance tomography unit of claim 1, wherein the transmission monitoring device comprises a plurality of sensors configured to detect a radiofrequency power, the plurality of sensors being respectively arranged in a transmit path of the plurality of transmit antennas.

3. The magnetic resonance tomography unit of claim 2, wherein the switching device is further configured to bring, controlled by the transmission monitoring device, at least one predetermined sensor of the plurality of sensors into a signal connection to the transmission monitoring device.

4. The magnetic resonance tomography unit of claim 3, wherein the transmission monitoring device is further configured to scale a signal from the at least one predetermined sensor by a predetermined weighting.

5. The magnetic resonance tomography unit of claim 1, further comprising a sensor with a signal connection to the transmission monitoring device,
   wherein the sensor is arranged in a transmit path, and
   wherein the switching device is further configured to bring, controlled by the transmission monitoring device, the transmit path into a signal connection to a predetermined transmit antenna for emitting a signal.

6. The magnetic resonance tomography unit of claim 5, wherein the transmit path has a hybrid coupler having at least two signal outputs, and
   wherein the switching device is further configured to connect a signal output of the hybrid coupler selectively to two different transmit antennas.

7. The magnetic resonance tomography unit of claim 5, wherein the transmit path has a hybrid coupler having at least two signal outputs, and
   wherein the switching device is further configured to connect the transmit path to the predetermined transmit antenna, bypassing the hybrid coupler.

8. A method for operating a magnetic resonance tomography unit including a transmitter, a transmission monitoring device for monitoring an excitation signal from the transmitter, a plurality of transmit antennas, and a switching device configured to bring the transmission monitoring device selectively into a signal connection to one transmit antenna of the plurality of transmit antennas, the method comprising:

connecting a transmit local coil to the magnetic resonance tomography unit;

making a signal connection between the transmission monitoring device and the transmit local coil using the switching device;

emitting an excitation signal from the transmitter via the transmit local coil;

receiving a monitoring signal from the transmit local coil via the signal connection to the transmission monitoring device;

comparing the monitoring signal with a reference value; and interrupting the emission depending on the comparison.

9. The method of claim 8, wherein the magnetic resonance tomography unit further includes a hybrid coupler, wherein the connecting comprises connecting the transmit local coil to a first signal output of the hybrid coupler.

\* \* \* \* \*